United States Patent
Stout et al.

(10) Patent No.: US 6,667,648 B2
(45) Date of Patent: Dec. 23, 2003

(54) VOLTAGE ISLAND COMMUNICATIONS CIRCUITS

(75) Inventors: Douglas W. Stout, Milton, VT (US); Scott T. Wameling, Willison, VT (US); Charles H. Windisch, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,425

(22) Filed: Apr. 23, 2002

(65) Prior Publication Data

US 2003/0197542 A1 Oct. 23, 2003

(51) Int. Cl.[7] .................................................. H03L 5/00
(52) U.S. Cl. ........................................ 327/333; 527/530
(58) Field of Search ................................. 327/333, 530, 327/535, 538, 545, 341, 362

(56) References Cited

U.S. PATENT DOCUMENTS

| | | | | | |
|---|---|---|---|---|---|
| 5,374,861 A | * | 12/1994 | Kubista | .................. | 326/30 |
| 5,608,757 A | * | 3/1997 | Smith et al. | ................ | 375/229 |
| 5,699,002 A | * | 12/1997 | Hayakawa | .................. | 327/202 |
| 5,737,364 A | * | 4/1998 | Cohen et al. | ................ | 375/220 |
| 5,748,024 A | * | 5/1998 | Takahashi et al. | .......... | 327/333 |
| 5,796,299 A | * | 8/1998 | Sei et al. | ..................... | 327/565 |
| 5,917,358 A | * | 6/1999 | Sanchez et al. | ............. | 327/333 |
| 6,208,494 B1 | * | 3/2001 | Nakura et al. | ................. | 361/56 |
| 6,362,644 B1 | * | 3/2002 | Jeffery et al. | ................. | 326/30 |
| 6,433,585 B1 | * | 8/2002 | Patel et al. | .................... | 326/83 |
| 6,472,911 B1 | * | 10/2002 | Sushihara | ................... | 327/112 |
| 6,545,521 B2 | * | 4/2003 | Dale et al. | .................. | 327/333 |

FOREIGN PATENT DOCUMENTS

JP        11177407 A   *  7/1999   ....... H03K/19/0175

* cited by examiner

Primary Examiner—Timothy P. Callahan
Assistant Examiner—Cassandra Cox
(74) Attorney, Agent, or Firm—Schmeiser, Olsen & Watts; Richard A. Henkler

(57) ABSTRACT

An integrated circuit comprising a first circuit powered by a first power supply. The first circuit sends a first signal referenced to the voltage of the first power supply to a second circuit powered by a second power supply. The second circuit receives the first signal and converts the first signal to a second signal of the same logical value as the first signal and is referenced to the voltage of the second power supply.

14 Claims, 12 Drawing Sheets

US 6,667,648 B2

VOLTAGE ISLAND COMMUNICATIONS CIRCUITS

BACKGROUND OF THE INVENTION

1. Field of the Invention

The present invention relates to the field of integrated circuits; more specifically, it relates to the communication circuits in integrated circuit chips containing voltage islands.

2. Background of the Invention

A voltage island is a group of circuits powered from the same voltage supply (different from the normal or global chip power supply), the power bus structure needed to distribute the voltage island power supply to the group of circuits, any functions needed to generate or switch between the voltage island power supply and the normal chip power supply, and any control elements needed to perform clock and power management, state saving, power sensing and input or output fencing during voltage changes.

A single chip design may implement several voltage islands, which simultaneously operate at the same or different voltages, yet must still be able to reliably communicate with one another and the rest of the chip. For example, the global voltage supply may be about 1 volt in order to reduce power consumption by the chip, but a voltage island containing special logic circuits may be supplied with a voltage island power supply of 3 volts in order to increase the performance of the logic circuit. Such a chip design may have global circuits, which are always powered on whenever at least one of the voltage islands is powered on, or may have global circuits that are not powered on whenever at least one of the voltage islands is powered on. The global power supply voltage value and individual voltage island power voltage values may vary substantially.

Further, as voltages change state, go from on to off or from off to on, it is necessary that communications between circuits in voltage islands and/or between voltage island circuits and global circuits be prevented from propagating unknown or indeterminate states or voltage values.

Therefore, there is a need for a distinct class of circuits to facilitate the communication between voltage islands or between voltage islands and global chip circuits that are well behaved over a wide range of voltage values even when some of the islands are selectively powered off.

BRIEF SUMMARY OF THE INVENTION

Summary of the Invention

A first aspect of the present invention is an integrated circuit comprising: a first circuit adapted to be powered by a first power supply, the first circuit adapted to send a first signal referenced to the voltage of the first power supply to a second circuit adapted to be powered by a second power supply, the second circuit adapted to receive the first signal and adapted to convert the first signal to a second signal of the same logical value as the first signal and referenced to the voltage of the second power supply.

A second aspect of the present invention is an integrated circuit comprising: a first circuit adapted to be powered by a first and a second power supply, the first circuit adapted to send a first signal referenced to the voltage of the second power supply to a second circuit adapted to be powered by the second power supply and a third power supply, the second circuit adapted to receive the first signal and converting the first signal to a second signal of the same logical value as the first signal and referenced to the voltage of the third power supply.

BRIEF DESCRIPTION OF THE SEVERAL VIEWS OF THE DRAWINGS

Brief Description of Drawings

Figure 1:
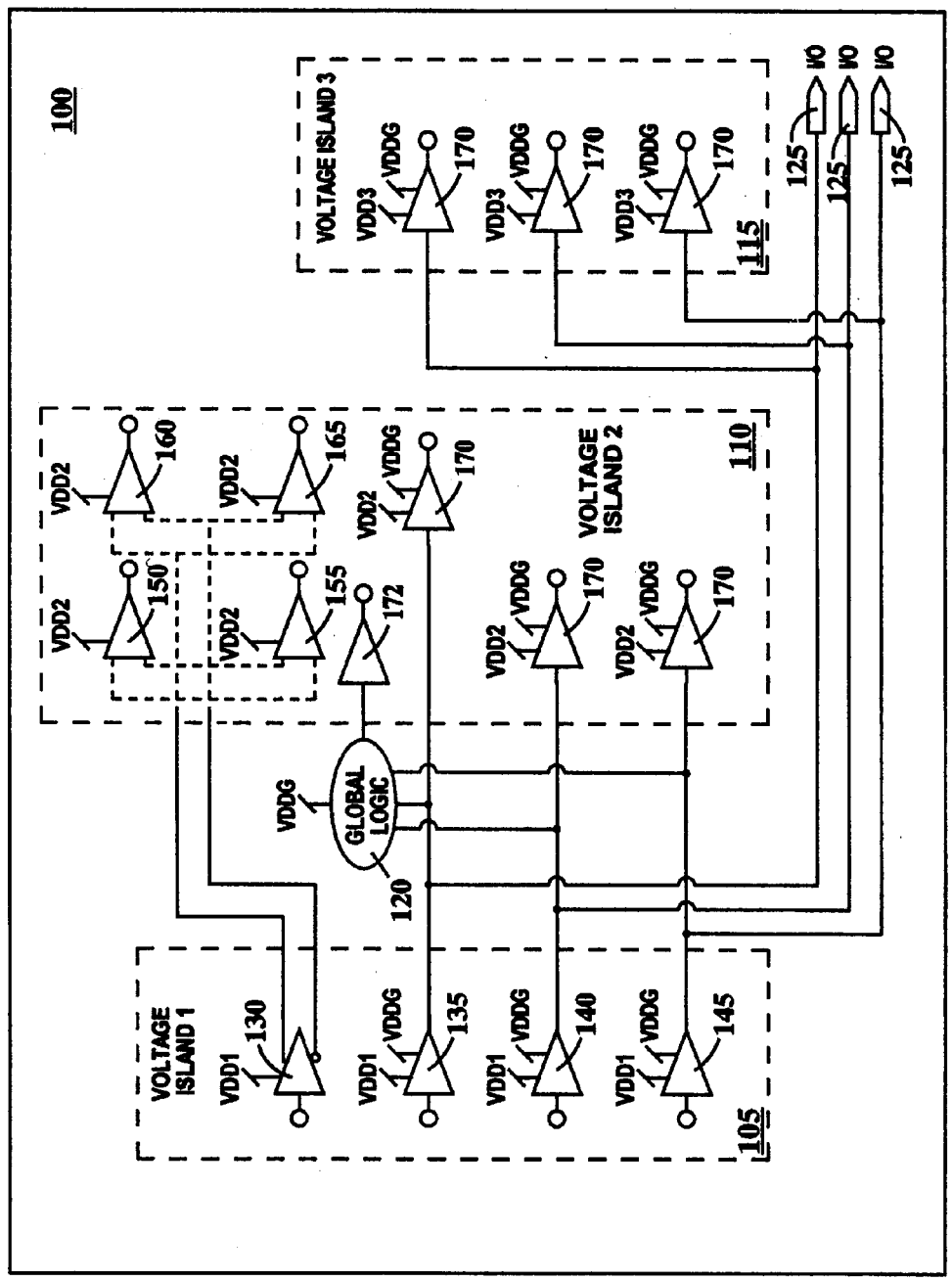
Figure 2:
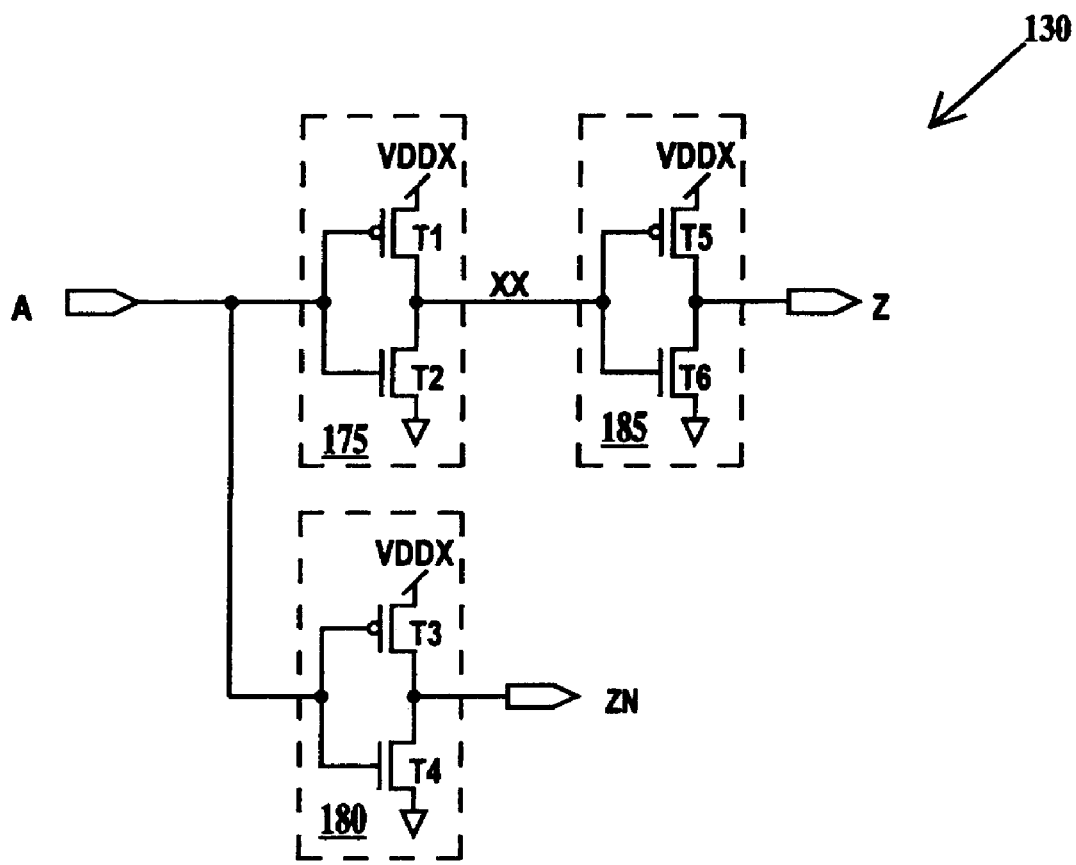
Figure 3:
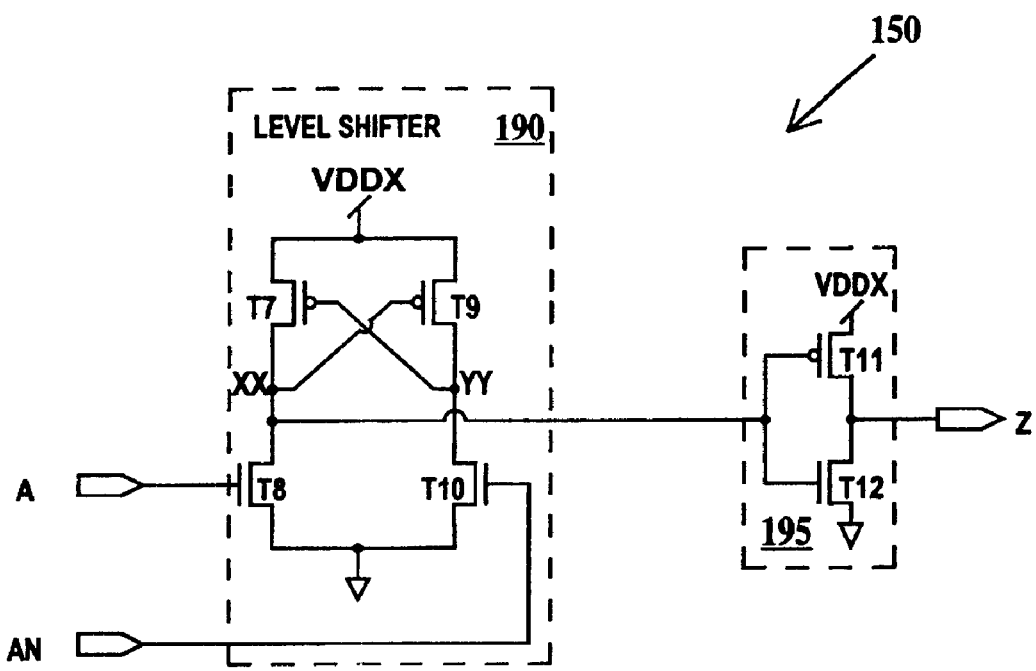
Figure 4:
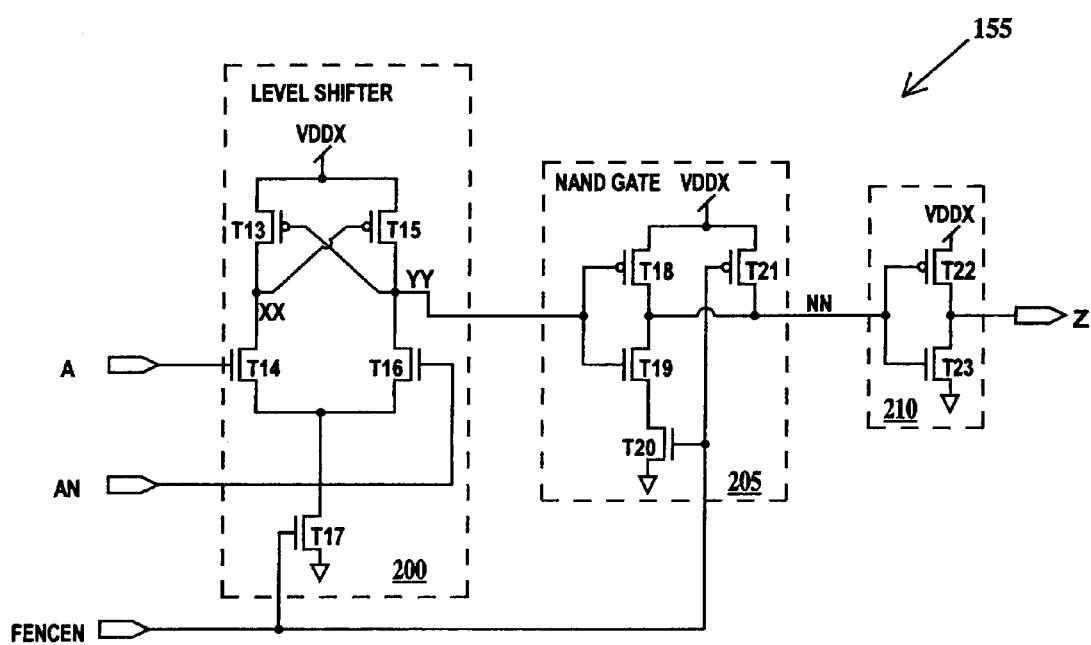
Figure 5:
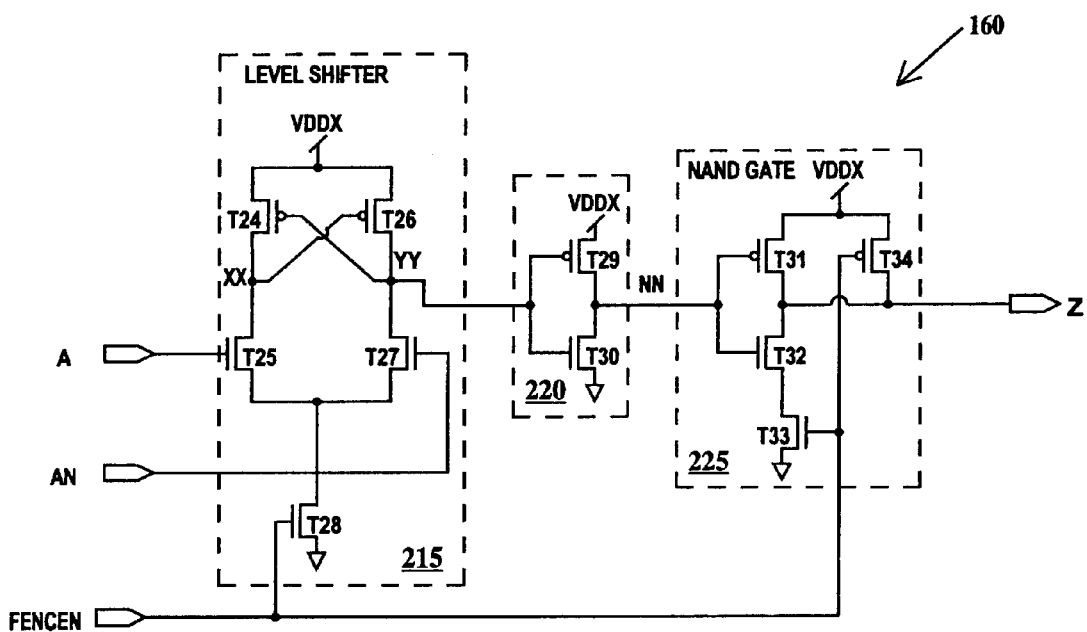
Figure 6:
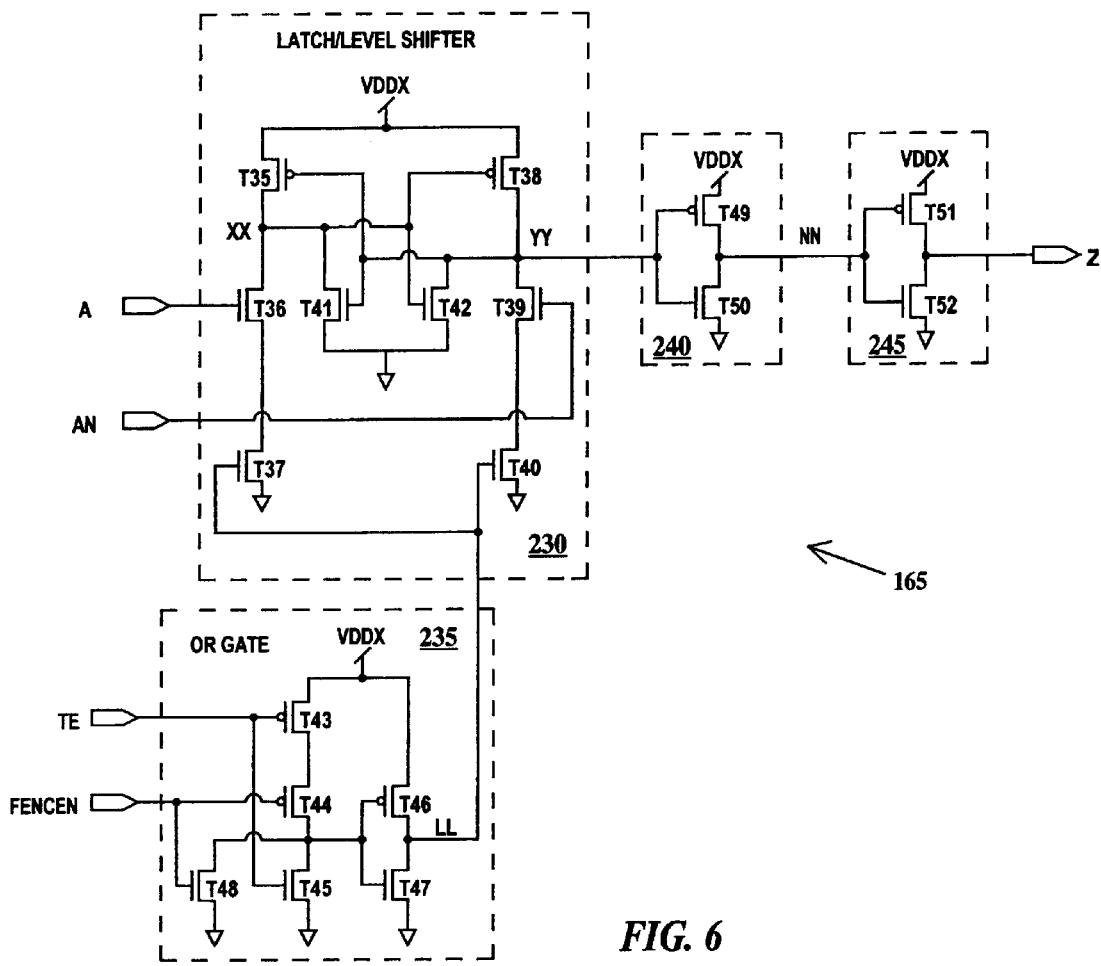
Figure 7:
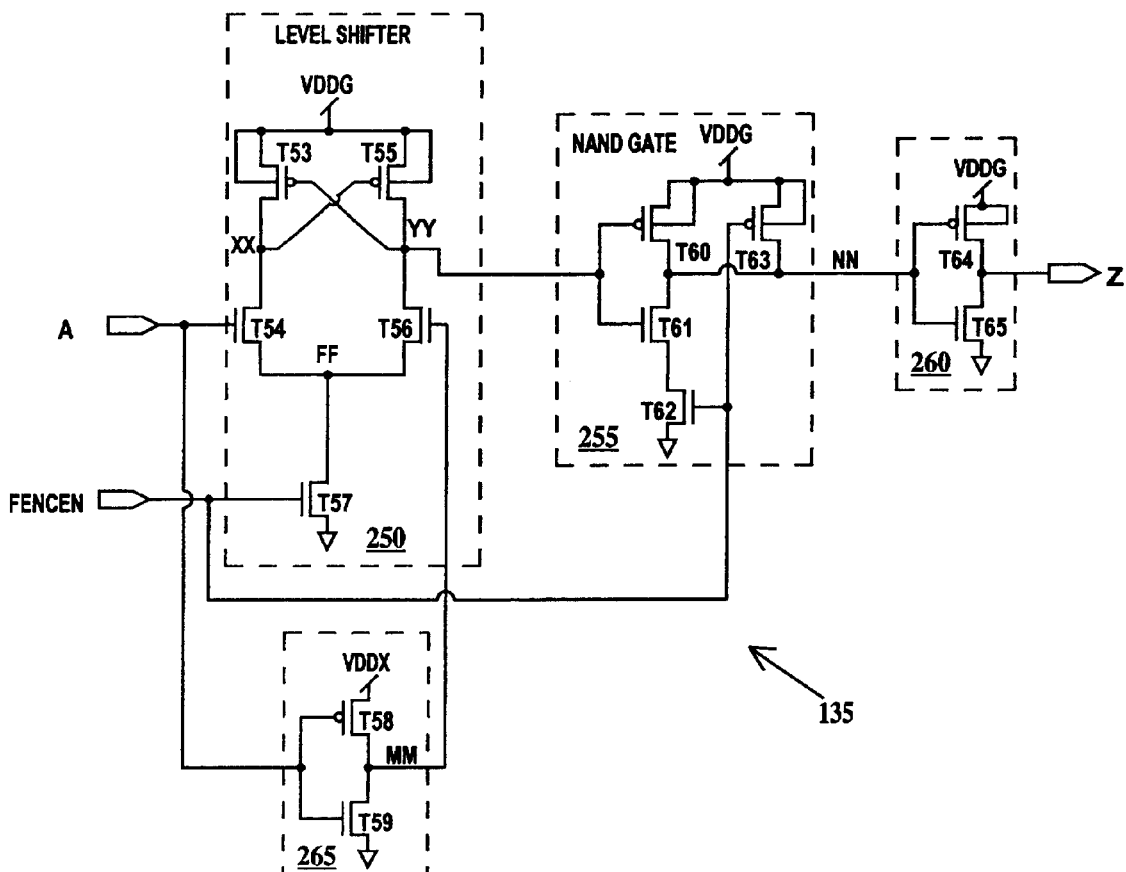
Figure 8:
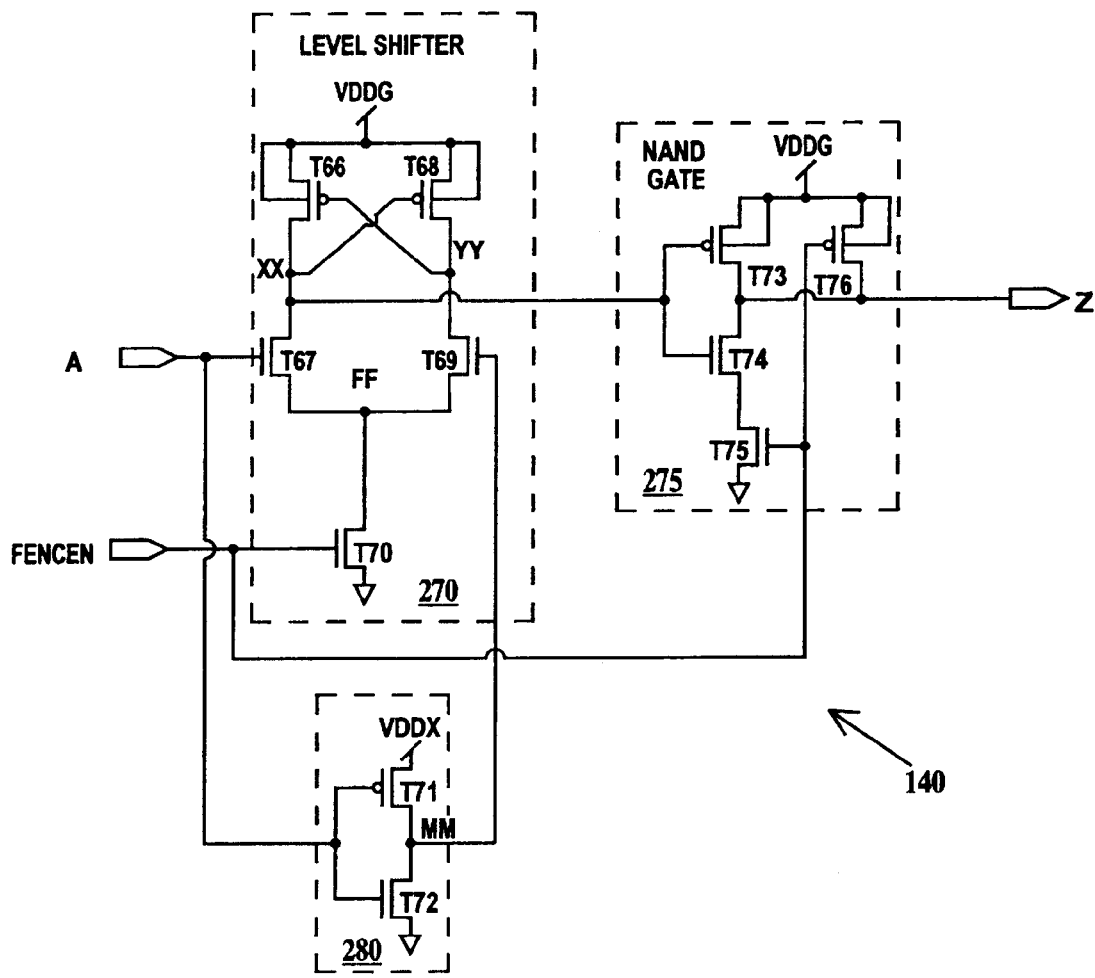
Figure 9:
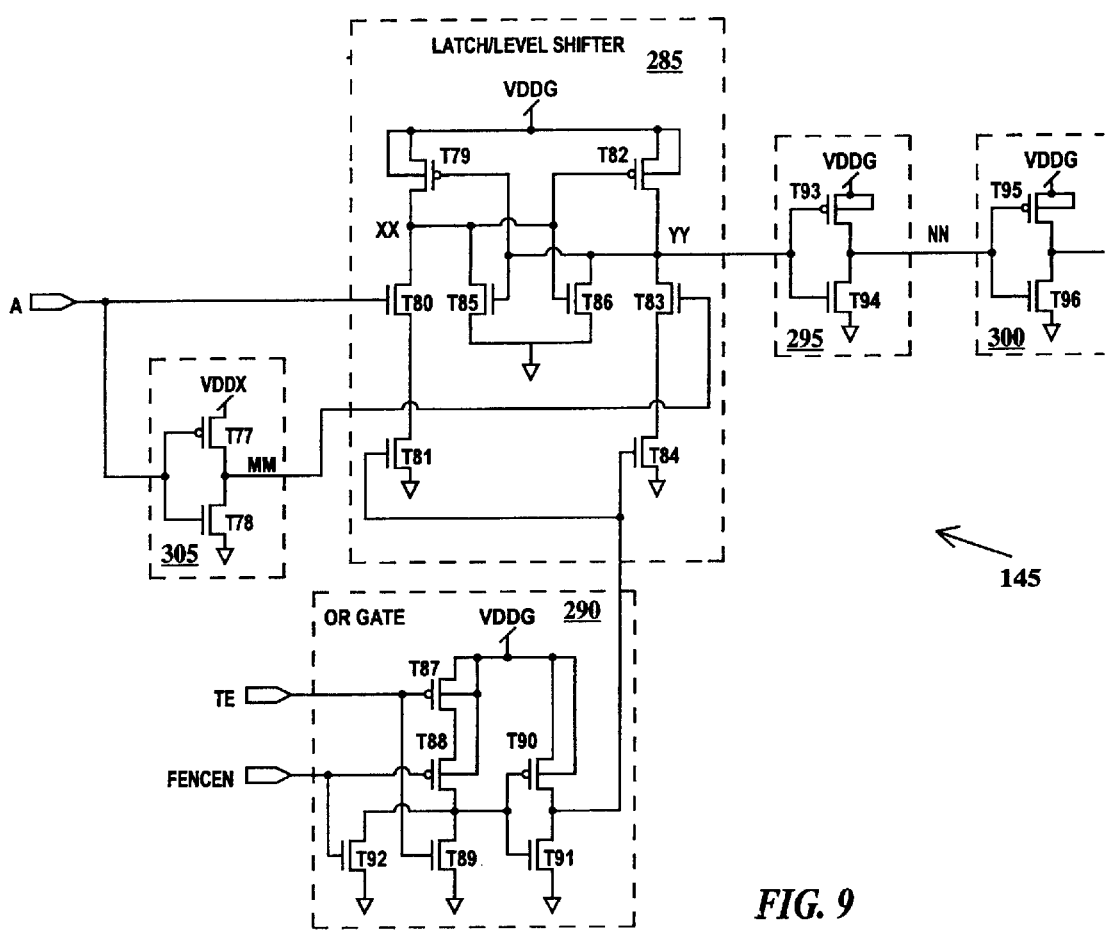
Figure 10:
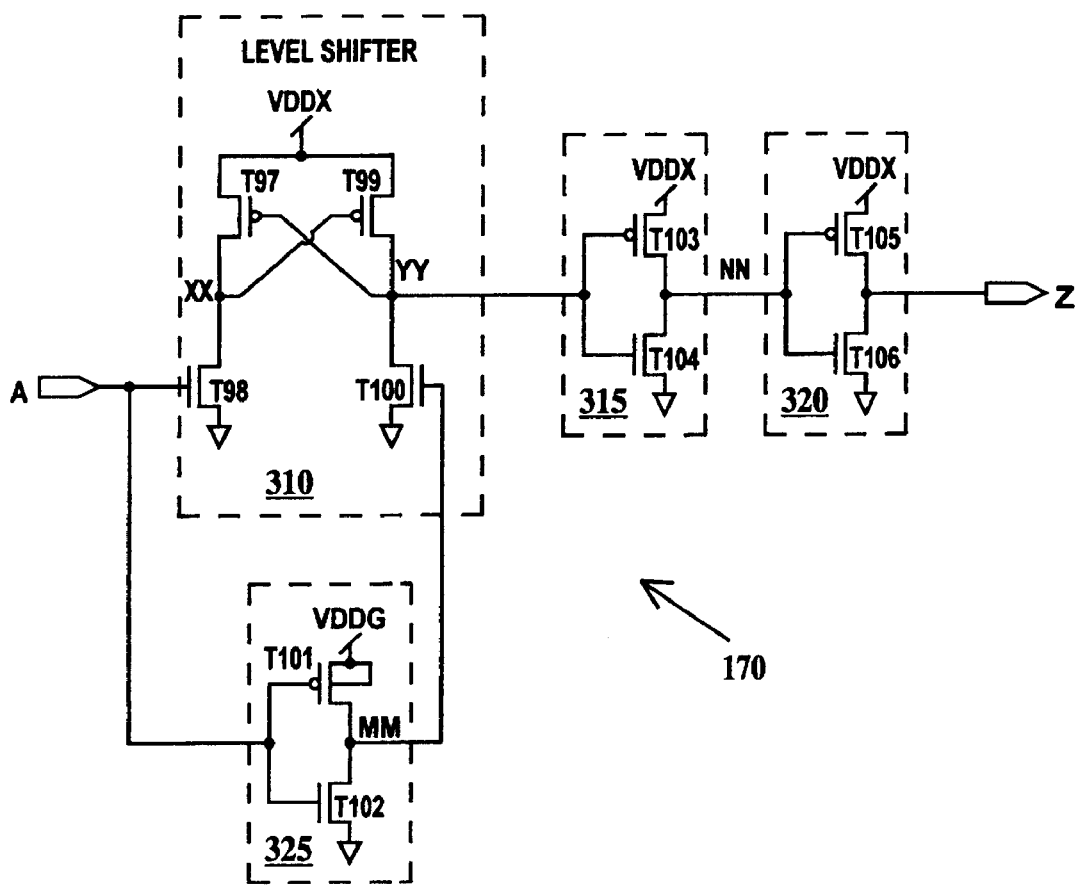
Figure 11:
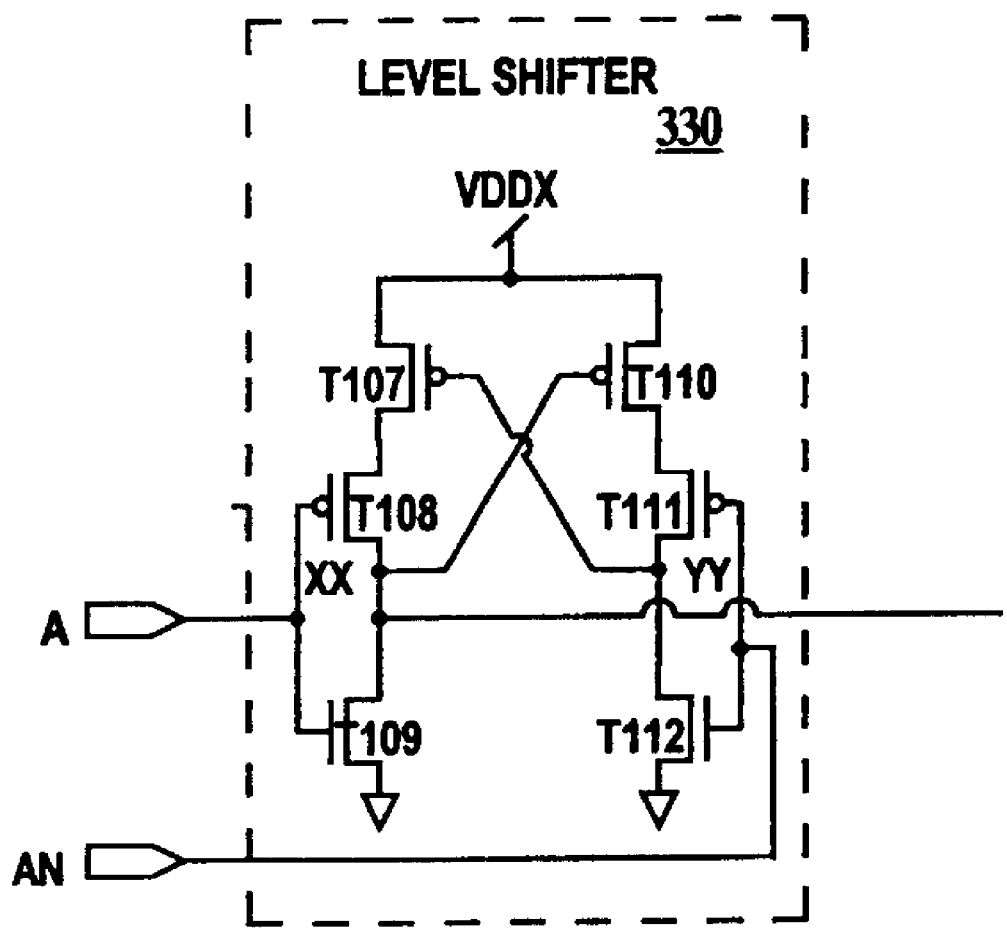
Figure 12:
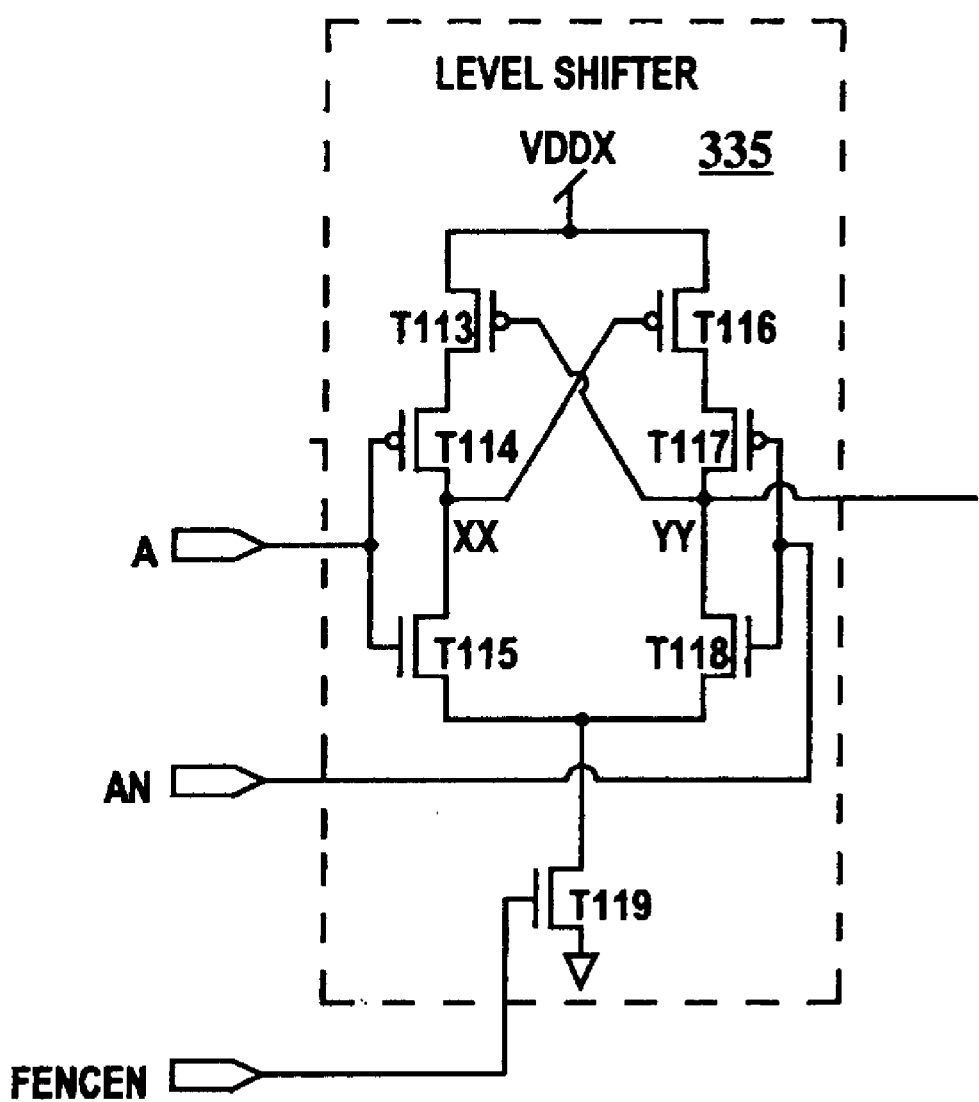

The features of the invention are set forth in the appended claims. The invention itself, however, will be best understood by reference to the following detailed description of an illustrative embodiment when read in conjunction with the accompanying drawings, wherein:

FIG. 1 is a schematic representation of a semiconductor device according to the present invention;

FIG. 2 is a schematic diagram of a differential driver circuit according to the present invention;

FIG. 3 is a schematic diagram of an differential receiver circuit according to the present invention;

FIG. 4 is a schematic diagram of a differential receiver circuit that fences a 0 state according to the present invention;

FIG. 5 is a schematic diagram of a differential receiver circuit that fences a 1 state according to the present invention;

FIG. 6 is a schematic diagram of a differential receiver circuit that holds the current state according to the present invention;

FIG. 7 is a schematic diagram of a single-ended driver circuit that fences a 0 state according to the present invention;

FIG. 8 is a schematic diagram of a single-ended driver circuit that fences a 1 state according to the present invention;

FIG. 9 is a schematic diagram of a single-ended driver circuit that holds the current state according to the present invention;

FIG. 10 is a schematic diagram of a single-ended receiver circuit according to the present invention;

FIG. 11 is a schematic diagram of an alternative level-shifter circuit according to the present invention; and FIG. 12 is a schematic diagram of an second alternative level-shifter circuit according to the present invention.

DETAILED DESCRIPTION OF THE INVENTION

VDDX (where X is an integer) is defined as the power supply voltages supplied only to corresponding voltage islands X and may represent the same or different voltages. VDDG is defined as a global voltage supplied to some or all of the voltage islands as well as non-voltage island portions of the chip. VDDG may be different from or equal to any given VDDX. Fencing is defined as the operation of holding outputs of a sending voltage island or inputs of a receiving voltage island at a known voltage while VDDX of the sending voltage island is off or sequencing on or off. VDDG is always powered as long as at least one voltage island is powered.

FIG. 1 is a schematic representation of a semiconductor device according to the present invention. FIG. 1 presents an illustrative example only and an unlimited number of variations are possible. In FIG. 1, chip 100 includes a first voltage island 105, a second voltage island 110, a third voltage island 115, global logic 120 and a plurality of I/O drivers 125. The present invention is not limited to three voltage islands. Semiconductor chip 100 may contain only one voltage island or as many voltage islands as the design of chip 100 requires.

First voltage island 105 includes a differential driver 130, a fence 0 single ended driver 135, a fence 1 single-ended driver 140 and a fence hold single-ended driver 145. Differential driver 130 is illustrated in FIG. 2 and described infra. Fence 0 single ended driver 135 is illustrated in FIG. 7 and described infra. Fence 1 single-ended driver 140 is illustrated in FIG. 8 and described infra. Fence hold single-ended driver 145 is illustrated in FIG. 9 and described infra.

Second voltage island 110 includes a differential receiver 150, a fence 0 differential receiver 155, a fence 1 differential receiver 160, a fence hold differential receiver 165, three single-ended receivers 170 and a general receiver 172 representing any one or more of receivers 150, 155, 160, 165 and 170. General receiver 172 is coupled to global logic 120 and illustrates the fact that global logic 120 may drive the input to any voltage island.

Third voltage island 115 contains three single-ended receivers 170. Differential receiver 150 is illustrated in FIG. 3 and described infra. Fence 0 differential receiver 155 is illustrated in FIG. 4 and described infra. Fence 1 differential receiver 160 is illustrated in FIG. 5 and described infra. Fence hold differential receiver 165 is illustrated in FIG. 6 and described infra. Single-ended receiver 170 is illustrated in FIG. 10 and described infra. Each voltage island may contain any number and any combination of differential drivers 130, fence 0 single-ended drivers 135, fence 1 single-ended drivers 140, fence hold single-ended drivers 145, differential receivers 150, fence 0 differential receivers 155, fence 1 differential receivers 160, fence hold differential receivers 165 and a single-ended receivers 170 as the design of chip 100 requires.

In FIG. 1, differential driver 130 is coupled to one or more of differential receivers 150, 155, 160 and 165. Differential driver 130 creates a true and complement output derived from the input to differential driver 130, the output referenced to VDD1 (the supply voltage of first voltage island 105). The true and complement output is propagated to second voltage island 110 and received by one of differential receivers 150, 155, 160 and 165 and level shifted to VDD2, (the supply voltage of second voltage island 110) and fencing operations performed in the case of differential receivers 155, 160 and 165.

In general, differential drivers create true and complement output of their input and that output is referenced to the supply voltage (VDDX) of the sending voltage island. The true and complement outputs are then propagated to a differential receiver on a receiving voltage island where the output is level shifted to the supply voltage of the receiving voltage island. Any given voltage island can be both a sending and a receiving voltage island. It also should be noted that fencing operations are performed by the differential receiver on the receiving island.

In FIG. 1, fence 0 single-ended driver 135 is coupled to single-ended receivers 170 on both second and third voltage islands 110 and 115 as well as to global logic 120. Fence 0 single-ended driver 135 level shifts VDD1 referenced input to VDDG referenced output. Fence 1 single-ended driver 140 is coupled to single-ended receivers 170 on both second and third voltage islands 110 and 115 as well as to global logic 120. Fence 1 single-ended driver 140 level shifts VDD1 referenced input to VDDG referenced output. Fence hold single-ended driver 145 is coupled to single-ended receivers 170 on both second and third voltage islands 110 and 115 as well as to global logic 120. Fence hold single-ended driver 145 level shifts VDD1 referenced input to VDDG referenced output. Single-ended receivers 170 located in second voltage island 110 to which single-ended driver 135, 140 and 145 are coupled, level shifts VDDG referenced input to VDD2 referenced output. Single-ended receivers 170 located in third voltage island 115 to which single-ended driver 135, 140 and 145 are coupled, level shifts VDDG referenced input to VDD3 referenced output. Output from single-ended driver 135, 140 and 145 received by global logic 120 or I/O drivers 125 is VDDG referenced.

It is not necessary that single-ended drivers 135, 140 and 145 be coupled to both single-ended receivers 170 on voltages islands 110 and 115 as well as global logic 120 and I/O drivers 125. Single-ended drivers 135, 140 and 145 may be coupled to any combination of one or more of single-ended receivers 170 on any number of voltage islands, to one or more points in global logic 120 and to one or more I/O drivers 125.

In general single-ended drivers level shift signals from sending voltage island power supply voltages VDDX to global power supply voltage VDDG. Single-ended receivers receive input at VDDG and level shift to receiving voltage island power supply voltage VDDX. VDDG and the VDDX of sending and the VDDX of receiving voltage islands may all have the same value, different values or combinations of the same and different values. Any given voltage island can be both a sending and a receiving voltage island. It also should be noted that fencing operations are performed by the single-ended drivers on the sending island.

From this point onward, VDDX and VDDG will be used in all schematic diagrams, as appropriate. To avoid confusion however, $VDDX_S$ and $VDDX_R$ will be used in describing the operation of circuits wherein, $VDDX_S$ will refer to the VDDX of the sending voltage island and $VDDX_R$ will refer to the VDDX of the receiving voltage island. Again, the actual voltage values associated with $VDDX_S$ and $VDDX_R$ may or may not be the same and may or may not be the same as VDDG.

FIG. 2 is a schematic diagram of a differential driver circuit according to the present invention. In FIG. 2, differential driver 130 has an input A and outputs Z and ZN and includes a first inverter 175, a second inverter 180 and a third inverter 185. The inputs of first and second invertors 175 and 180 are coupled to an input A of differential driver 130. The output of first inverter 175 is coupled to the input of third inverter 185. The output of second inverter 180 is coupled to output ZN. The output of third inverter 185 is coupled to output Z of differential driver 150.

First inverter 175 includes a PFET (P channel field effect transistor) T1 and an NFET (N channel field effect transistor) T2. The gates of PFET T1 and NFET T2 are coupled to input A, the source of PFET T1 is coupled to VDDX and the source of NFET T2 is coupled to ground. The drains of PFET T1 and NFET T2 are coupled to a node XX.

Second inverter 180 includes a PFET T3 and an NFET T4. The gates of PFET T3 and NFET T4 are coupled to input A, the source of PFET T3 is coupled to VDDX and the source of NFET T4 is coupled to ground. The drains of PFET T3 and NFET T4 are coupled to output ZN.

Third inverter 185 includes a PFET T5 and an NFET T6. The gates of PFET T5 and NFET T6 are coupled to a node XX (the output of first inverter 175), the source of PFET T5 is coupled to VDDX and the source of NFET T6 is coupled to ground. The drains of PFET T5 and NFET T6 are coupled to output Z.

In operation, differential driver 130 receives a single signal from within a voltage island at an input A and converts it to a full swing differential signals at Z and ZN, referenced to $VDDX_S$. Second inverter 180 produces the complement of the signal presented at input A at output ZN.

First and third inverters 175 and 185 produce the signal presented at input A at output Z. Differential driver 130 is always paired with one of differential receiver 150, fence 0 differential receiver 155, fence 1 differential receiver 160 or fence hold differential receiver 165 (see FIG. 1).

FIG. 3 is a schematic diagram of a differential receiver circuit according to the present invention. In FIG. 3, differential receiver 150 has inputs A and AN and an output Z and includes a level shifter 190 and an inverter 195. Inputs of level shifter 190 are coupled to inputs A and AN of differential receiver 150. The input of inverter 195 is coupled to the output of level shifter 190 and the output of inverter 195 is coupled to output Z of differential receiver 150.

Level shifter 190 includes PFETs T7 and T9 and NFETs T8 and T10. Input A is coupled to the gate of NFET T8 and input AN is coupled to the gate of NFET T10. The sources of PFETs T7 and T9 are coupled to VDDX and the sources of NFETs T8 and T10 are coupled to ground. The drains of PFET T7 and NFET T8 and the gate of PFET T9 are coupled to a node XX. The drains of PFET T9 and NFET T10 and the gate of PFET T7 are coupled to a node YY.

Inverter 195 includes a PFET T11 and an NFET T12. The gates of PFET T11 and NFET T12 are coupled to node XX, the source of PFET T11 is coupled to VDDX and the source of NFET T12 is coupled to ground. The drains of PFET T11 and NFET T12 are coupled to output Z.

In operation, differential receiver 150 receives true and complement signals referenced at $VDDX_S$ at inputs A and AN respectively and level shifts those signals to $VDDX_R$. If the signal on input A is a logical 0 and the signal on input AN is a logical 1, then NFET T10 is turned on, pulling node YY to ground. Node YY being pulled to ground causes PFET T7 to turn on, which will pull node XX to $VDDX_R$ and ensure that PFET T9 is off. Inverter 195 inverts the signal at node XX to produce a logical 0 at output Z. If the signal on input A is a logical 1 and the signal on input AN is a logical 0, then NFET T8 is turned on, pulling node XX to ground. Node XX being pulled to ground causes PFET T9 to turn on, which will pull node YY to $VDDX_R$ and ensure that PFET T7 is off. Inverter 195 inverts the signal at node XX to produce a logical 1 at output Z.

FIG. 4 is a schematic diagram of a differential receiver circuit that fences a 0 state according to the present invention. In FIG. 4, fence 0 differential receiver 155 has inputs A, AN and FENCEN and an output Z and includes level shifter 200, a NAND gate 205 and an inverter 210. Inputs of level shifter 200 are coupled to inputs A, AN and FENCEN of fence 0 differential receiver 155. The input of NAND gate 205 is coupled to the output of level shifter 200 as well as FENCEN. The input of inverter 210 is coupled to the output of NAND gate 205 and the output of inverter 210 is coupled to output Z of fence 0 differential receiver 155.

Level shifter 200 includes PFETs T13 and T15 and NFETs T14, T16 and T17. Input A is coupled to the gate of NFET T14 and input AN is coupled to the gate of NFET T16. The sources of PFETs T13 and T15 are coupled to VDDX and the sources of NFETs T14 and T16 are coupled to the drain of NFET T17. The drains of PFET T13 and NFET T14 and the gate of PFET T15 are coupled to a node XX. The drains of PFET T15 and NFET T16 and the gate of PFET T13 are coupled to a node YY. The gate of NFET 17 is coupled to input FENCEN and the source of NFET 17 is coupled to ground.

NAND gate 205 includes PFETS T18 and T21 and NFETS T19 and T20. The gates of PFET T18 and NFET T19 are coupled to node YY of level shifter 200. The sources of PFETs T18 and T21 are coupled to VDDX and the drains of PFETS T18 and T21 and NFET T19 are coupled to a node NN. The source of NFET T19 is coupled to the drain of NFET T20 and the gate of NFET T20 is coupled to both the gate of PFET T21 and input FENCEN. The source of NFET T20 is coupled to ground.

Inverter 210 includes a PFET T22 and an NFET T23. The gates of PFET T22 and NFET T23 are coupled to node NN, the source of PFET T22 is coupled to VDDX and the source of NFET T23 is coupled to ground. The drains of PFET T22 and NFET T23 are coupled to output Z.

In operation, fence 0 differential receiver 155 receives true and complement signals referenced to $VDDX_S$ at inputs A and AN respectively and level shifts those signals to $VDDX_R$. Operation of the level shifter 200 portion of fence 0 differential receiver 155 is the same as the operation of level shifter 190 illustrated in FIG. 3 and described supra as long as a logical 1 is applied to input FENCEN which turns on NFET T17, wherein PFETS T13 and T15 and NFETs T14 and T16 of level shifter 200 correspond respectively to PFETs T7 and T9 and NFETs T8 and T10 of level shifter 190.

If node YY is at a logical 0 and input FENCEN is at a logical 1 then PFET T18 is turned on, NFET T19 is turned off and NFET T20 is turned on and PFET T21 is turned off producing a logical 1 at node NN and inverter 210 inverts the signal at node NN to produce a logical 0 at output Z. If node YY is at a logical 1 and input FENCEN is at a logical 1 then PFETs T18 and T21 are turned off and NFETs T19 and T20 are turned on producing a logical 0 at node NN and inverter 210 inverts the signal at node NN to produce a logical 1 at output Z.

However if FENCEN is at a logical 0 then output Z is forced to a logical 0 regardless of the input at A and AN because PFET T21 is turned on pulling node NN to a logical 1 and inverter 210 inverts the signal at node NN to produce a logical 0 at output Z.

FIG. 5 is a schematic diagram of a differential receiver circuit that fences a 1 state according to the present invention. In FIG. 5, fence 1 differential receiver 160 has inputs A, AN and FENCEN and an output Z and includes level shifter 215, an inverter 220 and a NAND gate 225. Inputs of level shifter 215 are coupled to inputs A, AN and FENCEN of fence 1 differential receiver 160. The input of inverter 220 is coupled to the output of level shifter 215 and the output of inverter 220 is coupled the input of NAND gate 225. The output of NAND gate 225 is coupled to output Z of fence 1 differential receiver 160.

Level shifter 215 includes PFETs T24 and T26 and NFETs T25, T27 and T28 and is the same as level shifter 200 of FIG. 4 described supra wherein PFETs T24 and T26 and NFETs T25, T27 and T28 of level shifter 215 correspond respectively to PFETs T13 and T15 and NFETs T14, T16 and T17 of level shifter 200.

Inverter 220 includes a PFET T29 and an NFET T30. The gates of PFET T29 and NFET T30 are coupled to node YY (the output) of level shifter 215. The source of PFET T29 is coupled to VDDX and the source of NFET T30 is coupled to ground. The drains of PFET T29 and NFET T30 are coupled to a node NN (the input) of NAND gate 225.

NAND gate 225 includes PFETS T31 and T34 and NFETS T32 and T33. NAND gate 225 is the same as NAND gate 205 of FIG. 4, wherein PFETS T31 and T34 and NFETs T32 and T33 correspond respectively to PFETS T18 and T21 and NFETS T19 and T20 of NAND gate 205.

In operation, fence 1 differential receiver 160 receives true and complement signals referenced at $VDDX_S$ at inputs A and AN respectively and level shifts those signals to VDDX$_R$. Other than the fact that a logical 0 at FENCEN forces output Z to a logical 1, operation of fence 1 differential receiver 160 operates similarly to fence 0 differential receiver 155 illustrated in FIG. 4 and described supra.

FIG. 6 is a schematic diagram of a differential receiver circuit that holds the current state according to the present invention. In FIG. 6, fence hold differential receiver 165 has inputs A, AN, FENCEN and TE and an output Z and includes a latch/level shifter 230, an OR gate 235, a first inverter 240 and a second inverter 245. Inputs of latch/level shifter 230 are coupled to inputs A and AN of fence hold differential receiver 165. The input of first inverter 240 is coupled to the output of latch/level shifter 230 and the output of first inverter 240 is coupled to the input of a second inverter 245. The output of second inverter 245 is coupled to output Z of fence hold differential receiver 165. Inputs of OR gate 235 are coupled to inputs TE (test enable) and FENCEN of fence hold differential receiver 165. The output of OR gate 235 is coupled to latch/level shifter 230 as described infra.

Latch/level shifter 230 includes PFETs T35 and T38 and NFETs T36, T37, T39, T40, T41 and T42. Input A is coupled to the gate of NFET T36 and input AN is coupled to the gate of NFET T39. The sources of PFETs T35 and T38 are coupled to VDDX. The drains of PFET T35 and NFETs T36 and T41 and the gates of PFET T38 and NFET T42 are coupled to a node XX. The drains of PFET T38 and NFETs T39 and T42 and the gates of PFET T35 and NFET T41 are coupled to a node YY (which is the output of latch/level shifter 230). The sources of NFETs T37 and T40 are coupled to ground. The gates of NFETs T37 and T40 are coupled to the output of OR gate 235 as described infra.

OR gate 235 includes PFETs T43, T44 and T46 and NFETs T48, T45 and T47. Input TE is coupled to the gates of PFET T43 and NFET T45. Input FENCEN is coupled to the gates of PFET T44 and NFET T48. The sources of PFETs T43 and T46 are coupled to VDDX. The drain of PFET T43 is coupled to the source of PFET T44. The drain of NFET T48 is coupled the drains of PFET T44 and NFET T45 and the gates of PFET T46 and NFET T47. The sources of NFETs T48, T45 and T47 are coupled to ground. Finally, the drains of PFET T46 and NFET T47 are coupled to the gates of NFETs T37 and T40 in latch/level shifter 230 via a node LL.

First inverter 240 includes a PFET T49 and an NFET T50. The gates of PFET T49 and NFET T50 are coupled to node YY (the output) of latch/level shifter 230, the source of PFET T49 is coupled to VDDX and the source of NFET T50 is coupled to ground. The drains of PFET T49 and NFET T50 are coupled to a node NN (the input) of second inverter 245.

Second inverter 245 includes a PFET T51 and an NFET T52. The gates of PFET T51 and NFET T52 are coupled to node NN, the source of PFET T51 is coupled to VDDX and the source of NFET T52 is coupled to ground. The drains of PFET T51 and NFET T52 are coupled to output Z.

In operation, fence hold differential receiver 165 receives true and complement signals referenced to VDDX$_S$ at inputs A and AN respectively and level shifts those signals to VDDX$_R$. The current signals on inputs A and AN are held in NFETs T41 and T42 when a logical 1 is present on either TE or FENCEN. If the signal on input A is a logical 0 and the signal on input AN is a logical 1, then output Z is at logical 0. If the signal on input A is a logical 1 and the signal on input AN is a logical 0, then output Z is at logical 1. NFETs T41 and T42 in combination with PFETs T35 and T38 provide the latching function of latch/level shifter 230. When a logical 0 is present on both TE and FENCEN, node LL is pulled to a logical 0 causing NFETs T37 and T40 to turn-off. With no path to ground, NFETs T36 and T39 are no longer able to effect the state of NFETs T41 and T42 or PFETs T35 and T38 which then hold the previous state of inputs A and AN and output Z is held at its present state regardless of new signals presented at inputs A and AN.

FIG. 7 is a schematic diagram of a fence 0 single-ended driver circuit that fences a 0 state according to the present invention. In FIG. 7, fence 0 single-ended driver 135 has inputs A and FENCEN and an output Z and includes a level shifter 250, a NAND gate 255, a first inverter 260 and a second inverter 265. Inputs of level shifter 250 are coupled to inputs A and FENCEN of fence 0 single-ended driver 135. The input of NAND gate 255 is coupled to the output of level shifter 250. The input of first inverter 260 is coupled to the output of NAND gate 255 and the output first of inverter 260 is coupled to output Z of fence 0 single-ended driver 135. The input of second inverter 265 is coupled to input A and the output of second inverter 265 is coupled to level shifter 250 as described infra.

Level shifter 250 includes PFETs T53 and T55 and NFETs T54, T56 and T57. Level shifter 250 is similar to level shifter 200 of FIG. 4 wherein, PFETs T53 and T55 and NFETs T54, T56 and T57 correspond respectively to PFETs T13 and T15 and NFETs T14, T16 and T17 of level shifter 200. The differences are the sources and bodies of PFETs T53 and T55 are coupled to VDDG and the gate of NFET T56 is coupled to a node MM in second inverter 265.

NAND gate 255 includes PFETS T60 and T63 and NFETS T61 and T62. NAND gate 255 is similar to NAND gate 205 of FIG. 4 wherein PFETS T60 and T63 and NFETS T61 and T62 correspond respectively to PFETS T18 and T21 and NFETS T19 and T20 of NAND gate 205. The differences are the sources and bodies of PFETs T60 and T63 are coupled to VDDG.

First inverter 260 includes a PFET T64 and an NFET T65. The gates of PFET T64 and NFET T65 are coupled to node NN (the output) of NAND gate 255, the source and body of PFET T64 is coupled to VDDG and the source of NFET T65 is coupled to ground. The drains of PFET T64 and NFET T65 are coupled to output Z.

Second inverter 265 includes a PFET T58 and an NFET T59. The gates of PFET T58 and NFET T59 are coupled to input A, the source of PFET T58 is coupled to VDDX and the source of NFET T59 is coupled to ground. The drains of PFET T58 and NFET T59 are coupled to the gate of NFET T56 in level shifter 250 via node MM.

In operation, single-ended driver 135 receives a signal referenced at VDDX$_S$ at input A. Second inverter 265 produces the complement of that signal on the gate of NFET T56 of level shifter 250. Level shifter 250 level shifts the signal at input A to a signal referenced to VDDG at node YY.

If input FENCEN is at a logical 1 then NFET T57 is turned on and node FF of level shifter 250 is held at ground. If input A is at a logical 1 then NFET T54 is on and NFET T56 is off with the result that node XX is at ground. With node XX at ground PFET T55 will turn on, pulling node YY to VDDG and node NN of NAND gate 255 will be pulled to ground and first inverter 260 will produce a logical 1 at output Z.

However, if input A is at a logical 0 (input FENCEN is at a logical 1) then NFET T56 is on and NFET T54 is off with the result that node YY will be pulled to ground. With node YY at ground PFET T60 in NAND gate 255 will turn on, pulling node NN to VDDG and first inverter 260 will produce a logical 0 at output Z.

The output Z is forced to a logical 0 regardless of the logical state of input A when input FENCEN is at a logical 0 as node FF is floating and the level shift circuit disabled. Node NN will be pulled to a logical 1 and first inverter 260 will invert the signal at node NN producing a logical 0 at output Z.

FIG. 8 is a schematic diagram of a single-ended driver circuit that fences a 1 state according to the present invention. In FIG. 8, fence 1 single-ended driver 140 has inputs A and FENCEN and an output Z and includes a level shifter 270, a NAND gate 275 and an inverter 280. Fence 1 single-ended driver 140 is similar to fence 0 single-ended driver 135 illustrated in FIG. 7 and described supra wherein, level shifter 270, NAND gate 275 and inverter 280 of fence 1 single-ended driver 140 correspond respectively to level shifter 250, NAND gate 255 and second inverter 265 of fence 0 single-ended driver 135. In operation, fence 1 single-ended driver 140 receives a signal referenced at $VDDX_S$ at input A and level shifts the signal at input A to a signal referenced to VDDG at output Z. Since there is no inverter between NAND gate 275 and output Z, fence 1 single-ended driver will produce a logical 1 on output node Z in response to a logical 0 signal on input FENCEN.

FIG. 9 is a schematic diagram of a single-ended driver circuit that holds the current state according to the present invention. In FIG. 9, fence hold single-ended driver 145 has inputs A, FENCEN and TE and an output Z and includes level a latch/shifter 285, an OR gate 290, a first inverter 295, a second inverter 300 and a third inverter 305. Fence hold single-ended driver 145 is similar to fence hold differential receiver 165 illustrated in FIG. 6 and described supra wherein, level shifter 285, OR gate 290, first inverter 295 and second inverter 300 of fence hold single-ended driver 145 correspond respectively to level shifter 230, OR gate 235, first inverter 240 and second inverter 245 of fence hold differential receiver 165. PFETs T79, T82 T93, T95 T87, T88 and T90 and NFET T83 of fence hold single-ended driver 145 correspond respectively to PFETs T35, T38, T49, T51, T43, T44 and T46 and NFET T39 of fence hold differential receiver 165. However, PFETs T79, T82 T93, T95 T87,T88 and T90 each have their bodies tied to VDDG. Additionally, fence hold single-ended driver 145 includes a third inverter coupled between input A and the gate of NFET T83 where the gate of corresponding NFET T39 of fence hold differential receiver 165 is coupled to input AN.

In operation fence hold single-ended driver 145 receives a signal referenced at $VDDX_S$ at input A. and level shifts the signal at input A to a signal referenced to VDDG at output Z. If the signal on input A is a logical 0 then output Z is at logical 0. If the signal on input A is a logical 1 then output Z is at logical 1. When a logical 0 is present on both TE and FENCEN, latch/level shifter 285 then holds the previous state of input A and output Z is held at its present state regardless of a new signal presented at input A.

FIG. 10 is a schematic diagram of a single-ended receiver circuit according to the present invention. In FIG. 10, single-ended receiver 170 has an input A and an output Z and includes a level shifter 310, a first inverter 315, a second inverter 320 and a third inverter 325. The input of level shifter 310 is coupled to input A of single-ended receiver 170. The input of first inverter 315 is coupled to the output of level shifter 310. The output of first inverter 315 is coupled to the input of second inverter 320 and the output second of inverter 320 is coupled to output Z of single-ended receiver 170. Input A is also coupled to the input of third inverter 325 and the output of third inverter 325 is coupled to level shifter 310 as described infra.

Level shifter 310 includes PFETs T97 and T99 and NFETs T98 and T100. Level shifter 310 is similar to level shifter 200 of FIG. 4 wherein, PFETs T97 and T99 and NFETs T98, and T100 correspond respectively to PFETs T13 and T15 and NFETs T14, and T16 of level shifter 200. The difference is the sources of NFETs T98 and T100 are coupled directly to ground instead of through another NFET (NFET T17) as in level shifter 200.

First inverter 315 includes a PFET T103 and an NFET T104. The gates of PFET T103 and NFET T104 are coupled to node YY (the output) of level shifter 310, the source and body of PFET T103 is coupled to VDDX and the source of NFET T104 is coupled to ground. The drains of PFET T103 and NFET T104 are coupled to node NN.

Second inverter 320 includes a PFET T105 and an NFET T106. The gates of PFET T105 and NFET T106 are coupled to node NN, the source of PFET T105 is coupled to VDDX and the source of NFET T106 is coupled to ground. The drains of PFET T105 and NFET T106 are coupled to output Z.

Third inverter 325 includes a PFET T101 and an NFET T102. The gates of PFET T101 and NFET T102 are coupled to input A, the source and body of PFET T101 is coupled to VDDG and the source of NFET T102 is coupled to ground. The drains of PFET T101 and NFET T102 are coupled to the gate of NFET T100 in level shifter 310 via node MM.

In operation, single-ended receiver 170 receives a signal referenced at VDDG at input A. Third inverter 325 produce the complement of that signal on the gate of NFET T100 of level shifter 310. Level shifter 310 level shifts the signal at input A to a signal referenced to $VDDX_R$ at node YY.

If input A is at a logical 1 then NFET T98 is on and NFET T100 is off with the result that node XX is at ground. With node XX at ground PFET T99 will turn on, pulling node YY to $VDDX_R$ and first inverter and second inverters 315 and 320 will produce a logical 1 at output Z.

However, if input A is at a logical 0 then NFET T100 is on and NFET T98 is off with the result that node YY will be pulled to ground and first inverter and second inverters 315 and 320 will produce a logical 0 at output Z.

FIG. 11 is a schematic diagram of an alternative level-shifter circuit according to the present invention. In FIG. 11, level shifter 330 includes PFETs T107, T108, T110 and T111 and NFETs T109 and T112. An input A is coupled to the gates of PFET T108 and NFET T109 and an input AN is coupled to the gates of PFET T111 and NFET T112. The sources of PFETs T107 and T110 are coupled to VDDX and the sources of NFETs T109 and T112 are coupled to ground. The drains of PFET T108 and NFET T109 and the gate of PFET T110 are coupled to a node XX. The drains of PFET T111 and NFET T112 and the gate of PFET T107 are coupled to a node YY. The drain of PFET T107 is coupled to the source of PFET T108 and the drain of PFET T110 is coupled to the source of PFET T111. Node XX is the output of level shifter 330. Level shifter 330 may be used in place of level shifter 190 in FIG. 3.

FIG. 12 is a schematic diagram of an second alternative level shifter circuit according to the present invention. In FIG. 12, level shifter 335 includes PFETs T113, T114, T116 and T117 and NFETs T115, T18 and T119. An input A is coupled to the gates of PFET T114 and NFET T115 and an input AN is coupled to the gates of PFET T117 and NFET T118. The sources of PFETs T113 and T116 are coupled to VDDX and the sources of NFETs T115 and T118 are coupled to the drain of NFET T119. The source of NFET T119 is coupled to ground and the gate of NFET T119 is coupled to an input FENCEN. The drains of PFET T114 and NFET T115 and the gate of PFET T116 are coupled to a node XX. The drains of PFET T117 and NFET T118 and the gate of PFET T113 are coupled to a node YY. The drain of PFET T113 is coupled to the source of PFET T114 and the drain of PFET T116 is coupled to the source of PFET T117. Node YY is the output of level shifter 335. Level shifter 335 may be used in place of level shifter 200 in FIG. 4 or level shifter 215 in FIG. 5 or with minor modifications as level shifter 250 illustrated in FIG. 7 and described supra.

The description of the embodiments of the present invention is given supra for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An integrated circuit comprising:
   a first circuit adapted to be powered by a first power supply and to send a first signal referenced to the voltage of the first power supply; and
   a second circuit adapted to be powered by a second power supply, to receive the first signal, and to convert the first signal to a second signal of the same logical value as the first signal referenced to the voltage of the second power supply, the second circuit including a latching circuit and a fencing circuit, the latching circuit adapted to latch the first signal, and the fencing circuit adapted to force an output of the second circuit to the logical value of the latched signal in response to the second circuit receiving a fencing signal.

2. The integrated circuit of claim 1, wherein said second circuit further includes a level shifting circuit and an OR gate.

3. An integrated circuit comprising:
   a single-ended driver adapted to be powered by a first and a second power supply, and to send a first signal referenced to the voltage of the second power supply; and
   a single-ended receiver adapted to be powered by the second power supply and a third power supply, and to receive the first signal, and convert the first signal to a second signal of the same logical value as the first signal and referenced to the voltage of the third power supply, the first, second, and third power supplies each adapted to supply power at a different voltage than a ground voltage.

4. The integrated circuit of claim 3, wherein the single-ended receiver includes a level shifting circuit and an inverter, and wherein an output of the inverter is coupled to the level shifting circuit.

5. An integrated circuit comprising:
   a first circuit adapted to be powered by a first power supply and to send a first signal referenced to the voltage of the first power supply; and
   a second circuit adapted to be powered by a second power supply, to receive the first signal, and to convert the first signal to a second signal of the same logical value as the first signal referenced to the voltage of the second power supply, the second circuit including a fencing circuit for forcing an output of the second circuit to a logical 0 in response to the second circuit receiving a fencing signal, wherein the second circuit further includes a level shifting circuit and a NAND gate, and wherein an input of the NAND gate is adapted to receive an output signal from the level shifting circuit.

6. An integrated circuit comprising:
   a first circuit adapted to be powered by a first power supply and to send a first signal referenced to the voltage of the first power supply; and
   a second circuit adapted to be powered by a second power supply to receive tile first signal, and to convert the signal to a second signal of the same logical value as the first signal referenced to the voltage of the second power supply, the second circuit including a fencing circuit for forcing an output of the second circuit to a logical 1 in response to the second circuit receiving a fencing signal, wherein the second circuit further includes a level shifting circuit and a NAND gate, and wherein an input of the NAND gate is coupled to an output of the level shifting circuit.

7. The integrated circuit of claim 6, wherein the input of the NAND gate is coupled to the output of the level shifting circuit by an inverter.

8. An integrated circuit comprising:
   a first circuit adapted to be powered by a first and a second power supply, and to send a first signal referenced to the voltage of said second power supply, the first circuit including a fencing circuit for forcing an output of the first circuit to a logical 0 in response to the first circuit receiving a fencing signal, wherein the first circuit further includes a level shifting circuit and a NAND gate, and wherein an input of the NAND gate is adapted to receive an output signal from the level shifting circuit; and
   a second circuit adapted to be powered by said second power supply and a third power supply, said second circuit adapted to receive said first signal converting said first signal to a second signal of the same logical value as said first signal and referenced to the voltage of said third power supply.

9. An integrated circuit comprising:
   a first circuit adapted to be powered by a first and a second power supply, and to send a first signal referenced to the voltage of said second power supply, the first circuit including a fencing circuit for forcing an output of the first circuit to a logical 1 in response to the first circuit receiving a fencing signal, wherein the first circuit further includes a level shifting circuit and a NAND gate, and wherein an input of the NAND gate is coupled to an output of the level shifting circuit; and
   a second circuit adapted to be powered by said second power supply and a third power supply, said second circuit adapted to receive said first signal and converting said first signal to a second signal of the same logical value as said first signal and referenced to the voltage of said third power supply.

10. The integrated circuit of claim 9, wherein the input of the NAND gate is coupled to the output of the level shifting circuit by an inverter.

11. An integrated circuit comprising:
    a first circuit adapted to be powered by a first and a second power supply, and to send a first signal referenced to the voltage of said second power supply, the first circuit including a latching circuit and a fencing circuit, the latching circuit adapted to latch the first signal, and the fencing circuit adapted to force an output of the first circuit to the logical value of the latched signal in response to the first circuit receiving a fencing signal; and a second circuit adapted to be powered by said second power supply and a third power supply, said second circuit adapted to receive said first signal and converting said first signal to a second signal of the same logical value as said first signal and referenced to the voltage of said third power supply.

12. The integrated circuit of claim 11, wherein, said first circuit includes a level shifting circuit and an OR gate.

13. An integrated circuit comprising:

first, second and third power supply, the second power supply adapted to be powered when either the first or second power supply is powered, the first, second, and third power supplies each adapted to supply power at a different voltage than a ground voltage;

a first circuit adapted to be powered by the first and second power supply, and to send a first signal referenced to the voltage of the second power supply; and a second circuit adapted to be powered by the second power supply and the third power supply, the second circuit adapted to receive the first signal and converting the first signal to a second signal of the same logical value as die first signal and referenced to the voltage of the third power supply.

14. An integrated circuit comprising:

first, second, and third power supplies, the second power supply adapted to be a global voltage supply, and the first and third voltage power supplies adapted to be voltage island power supplies, the first, second, and third power supplies each adapted to supply power at a different voltage that a ground voltage;

first circuit adapted to be powered by the first and second power supply, and to send a first signal referenced to the voltage of the second power supply; and a second circuit adapted to be powered by the second power supply and the third power supply, the second circuit adapted to receive the first signal and converting the first signal to a second signal of the same logical value as the first signal and referenced to the voltage of the third power supply.

\* \* \* \* \*